US012805013B2

(12) United States Patent
Verma et al.

(10) Patent No.: US 12,805,013 B2
(45) Date of Patent: Nov. 17, 2026

(54) THREE DIMENSIONAL STRUCTURE WITH FD-SOI TRANSISTOR

(71) Applicant: UNITED MICROELECTRONICS CORP., Hsin-Chu City (TW)

(72) Inventors: Purakh Raj Verma, Singapore (SG); Ching-Yang Wen, Singapore (SG); Kai Cheng, Singapore (SG)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 383 days.

(21) Appl. No.: 18/544,471

(22) Filed: Dec. 19, 2023

(65) Prior Publication Data

US 2025/0194244 A1 Jun. 12, 2025

(30) Foreign Application Priority Data

Dec. 6, 2023 (TW) ................................ 112147424

(51) Int. Cl.

| | |
|---|---|
| ***H10D 86/00*** | (2025.01) |
| ***H10D 30/01*** | (2025.01) |
| ***H10D 30/60*** | (2025.01) |
| ***H10D 30/63*** | (2025.01) |
| ***H10D 86/01*** | (2025.01) |
| ***H10W 10/00*** | (2026.01) |
| ***H10W 10/20*** | (2026.01) |

(52) U.S. Cl.

CPC ......... *H10D 86/201* (2025.01); *H10D 30/023* (2025.01); *H10D 30/611* (2025.01); *H10D 30/637* (2025.01); *H10D 86/01* (2025.01); *H10W 10/021* (2026.01); *H10W 10/20* (2026.01)

(58) Field of Classification Search

CPC .. H10D 86/201; H10D 30/023; H10D 30/611; H10D 30/637; H10D 86/01; H10D 30/6734; H10W 10/021; H10W 10/20

See application file for complete search history.

(56) References Cited

U.S. PATENT DOCUMENTS 5,087,585 A * 2/1992 Hayashi .................. H10P 72/74 438/455
6,022,804 A * 2/2000 Yano ..................... H10W 20/42 438/618
8,890,247 B2 * 11/2014 Bedell ................. H10P 90/1906 438/10
9,343,369 B2 * 5/2016 Du ......................... H10D 88/00
10,062,712 B1 * 8/2018 Moen ................... H10D 86/201
10,460,944 B2 * 10/2019 Cheng ................ H10D 30/0275
(Continued)

*Primary Examiner* — Mohammed Shamsuzzaman
(74) *Attorney, Agent, or Firm* — Winston Hsu

(57) ABSTRACT

A three-dimensional structure with an FD-SOI transistor includes a handler wafer, a first device layer and a second device layer stacked in sequence from bottom to top. The first device layer includes a first SOI layer, a first FD-SOI transistor and a first back gate. The first SOI layer includes a first front side and a first back side. The first FD-SOI transistor is disposed on the first front side. The first back gate is disposed on the first back side. The second device layer includes a second SOI layer, a second FD-SOI transistor and a second back gate. The second SOI layer includes a second front side and a second back side. The second FD-SOI transistor is disposed on the second front side. The second back gate is disposed on the second back side.

8 Claims, 7 Drawing Sheets

(56) References Cited

U.S. PATENT DOCUMENTS

| | | | | |
|---|---|---|---|---|
| 10,515,876 | B1 * | 12/2019 | Zhou | H10W 20/072 |
| 10,559,594 | B2 * | 2/2020 | Tarakji | H10D 84/0149 |
| 12,588,489 | B2 * | 3/2026 | Hong | H10W 20/427 |
| 2019/0252375 | A1 * | 8/2019 | Delacruz | H10D 86/01 |
| 2022/0020741 | A1 * | 1/2022 | Delacruz | H10D 86/01 |

* cited by examiner

THREE DIMENSIONAL STRUCTURE WITH FD-SOI TRANSISTOR

BACKGROUND OF THE INVENTION

1. Field of the Invention

The present invention relates to a fully depleted silicon-on-insulator (FD-SOI) transistor, and particularly to a three-dimensional (3D) structure with an FD-SOI transistor.

2. Description of the Prior Art

The market has a strong demand for advanced semiconductor processes. From the latest 5G mobile communication technology to the new generation of semiconductor applications such as artificial intelligence and smart cars that have been extremely popular recently.

Most new applications depend on new semiconductor processes to enable terminals, and make terminal application modules to achieve smaller size, lower power consumption, and lower cost.

5G mobile communication technology is committed to faster transmission speeds, massive information transmission and low latency, the demand for process technology is greater than ever. To improve product performance to a higher level can start from two directions: process shrinkage and advanced packaging. If process level is scaled down, cost of semiconductor equipment increases, yields and technical difficulties will also raise. Therefore, it is currently a mainstream to use advanced package to improve performance, process costs and physical limitations.

SUMMARY OF THE INVENTION

In view of this, the present invention provides a 3D structure with FD-SOI transistors, which reduces the size of a chip by stacking wafers.

According to a preferred embodiment of the present invention, a 3D structure with an FD-SOI transistor includes a handler wafer, a first device layer and a second device layer stacked from bottom to top in sequence, wherein the first device layer includes a first silicon-on-insulator (SOI) layer. The first SOI layer includes a first front side and a first back side. A first FD-SOI transistor is disposed on the first front side. A first back gate is disposed on the first back side. The second device layer includes a second SOI layer. The second SOI layer includes a second front side and a second back side. A second FD-SOI transistor is disposed on the second front side. A second back gate is disposed on the second back side. A first metal interconnection set electrically connects to a source of the first FD-SOI transistor and a source of the second FD-SOI transistor. A second metal interconnection set electrically connects to a drain of the first FD-SOI transistor and a drain of the second FD-SOI transistor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1 to 6 depict a fabricating method of a three-dimensional (3D) structure with a fully depleted silicon-on-insulator (FD-SOI) transistor according to a preferred embodiment of the present invention, wherein:

FIG. 1 depicts a handler wafer with an FD-SOI transistor thereon;

FIG. 2 is a fabricating stage in continuous of FIG. 1;

FIG. 3 is a fabricating stage in continuous of FIG. 2;

FIG. 4 is a fabricating stage in continuous of FIG. 3;

FIG. 5 is a fabricating stage in continuous of FIG. 4; and

FIG. 6 is a fabricating stage in continuous of FIG. 5.

DETAILED DESCRIPTION

FIGS. 1 to 6 depict a fabricating method of a three-dimensional (3D) structure with a fully depleted silicon-on-insulator (FD-SOI) transistor according to a preferred embodiment of the present invention.

Figure 1:
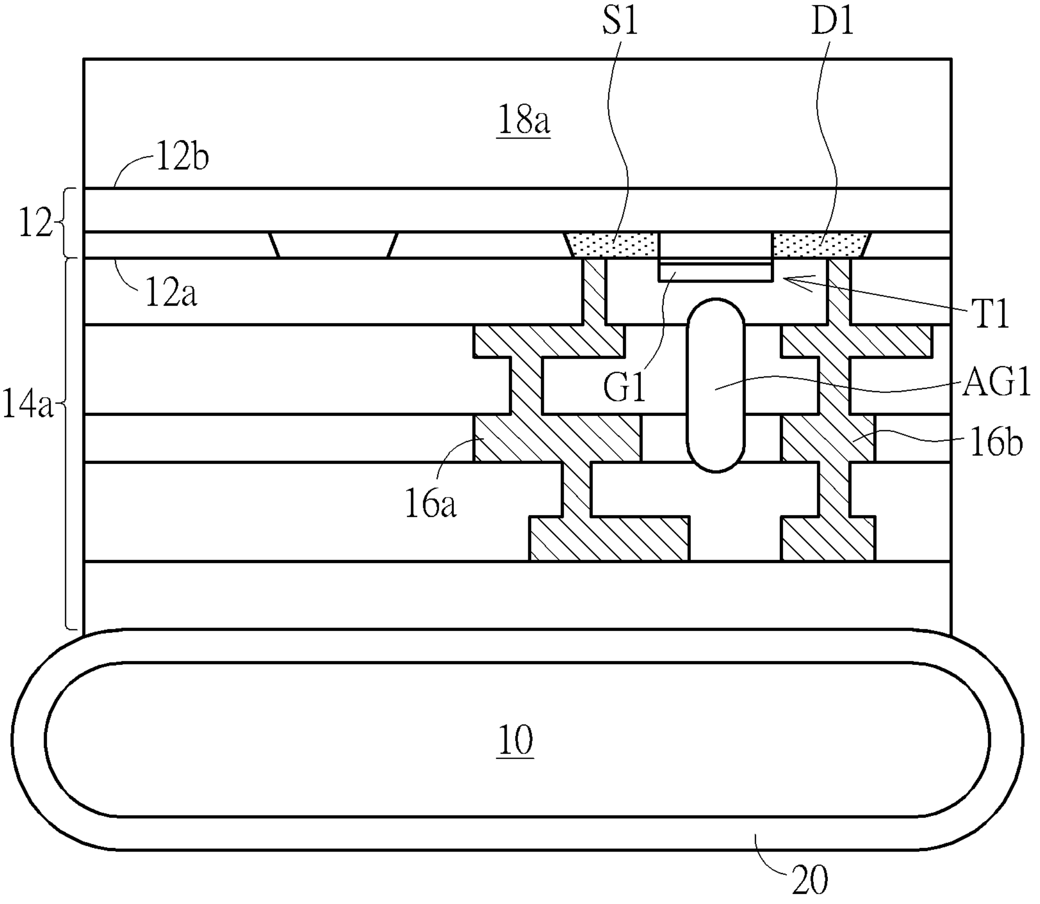

As shown in FIG. 1, a handler wafer 10 and a first silicon-on-insulator (SOI) layer 12 are provided. The handler wafer 10 may be a high-resistance silicon wafer, an insulating material, or a trap-rich substrate. The first SOI layer 12 includes a first front side 12*a* and a first back side 12*b*. The first front side 12*a* is opposite to the first back side 12*b*. A first FD-SOI transistor T1 is disposed on the first front side 12*a*. A first dielectric layer 14*a* covers and contacts the first front side 12*a* and the first FD-SOI transistor T1. A first air gap AG1 is embedded in the first dielectric layer 14*a* and is disposed directly above the gate G1 of the first FD-SOI transistor T1. A first conductive line 16*a* is embedded in the first dielectric layer 14*a* and electrically connected to a source S1 of the first FD-SOI transistor T1. A second conductive line 16*b* is embedded in the first dielectric layer 14*a* and electrically connected to a drain D1 of the first FD-SOI transistor T1. A low-resistance handler wafer 18*a* contacts the first back side 12*b*. Then, a silicon oxide layer 20 is formed to encapsulate the wafer 10. Next, the first dielectric layer 14*a* and the silicon oxide layer 20 are brought into contact. Next, the first dielectric layer 14*a* and the silicon oxide layer 20 are heated to bond the first dielectric layer 14*a* to the silicon oxide layer 20.

Figure 2:
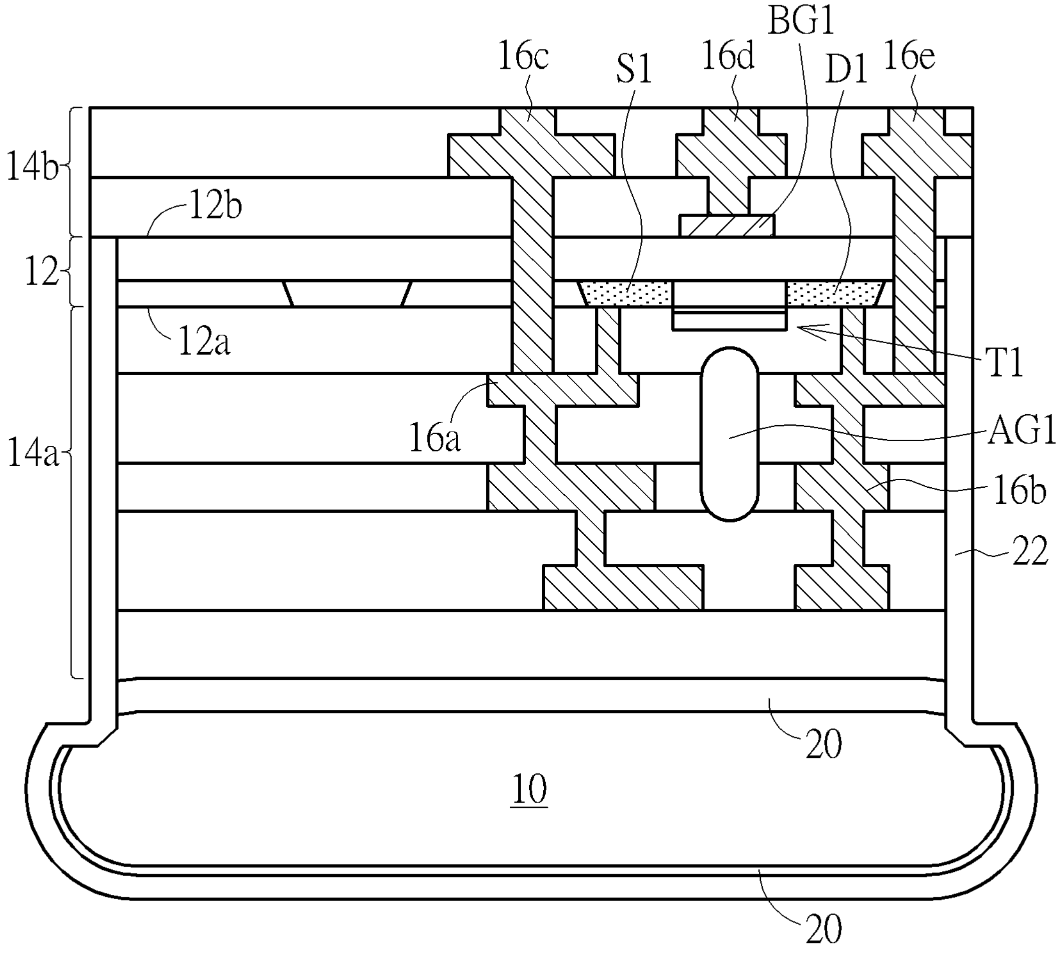

As shown in FIG. 2, the edge of the handler wafer 10 is trimmed. Later, a silicon oxide layer 22 is formed to cover the silicon oxide layer 20, both sides of the first dielectric layer 14*a* and the low-resistance handler wafer 18*a*. After that, the low-resistance handler wafer 18*a* is removed to expose the first side 12*b* of the first SOI layer 12. Then, a first back gate BG1 is formed on the first back side 12*b*. Thereafter, a second dielectric layer 14*b* is formed to cover the first back side 12*b*. A third conductive line 16*c*, a fourth conductive line 16*d* and a fifth conductive line 16*e* are embedded in the second dielectric layer 14*b*. The third conductive line 16*c* and the fifth conductive line 16*e* penetrate the first SOI layer 12. The third conductive line 16*c* contacts the first conductive line 16*a*, and the fifth conductive line 16*e* contacts the second conductive line 16*b*. The fourth conductive line 16*d* contacts the first back gate BG1.

Figure 3:
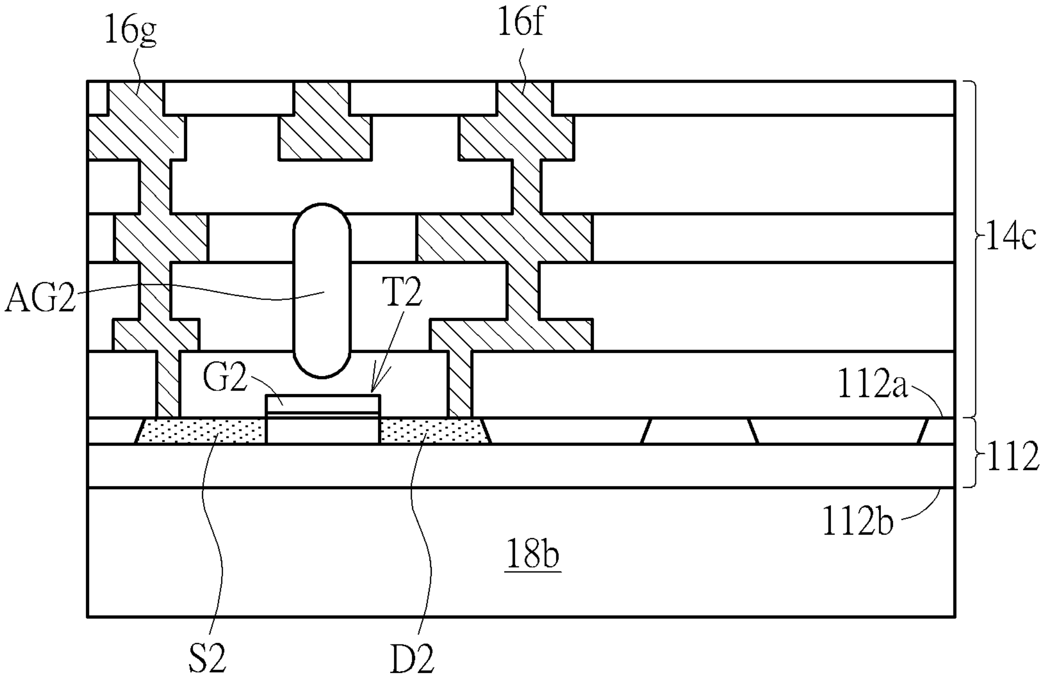

As shown in FIG. 3, a second SOI layer 112 is provided. The second SOI layer 112 includes a second front side 112*a* and a second back side 112*b*. The second front side 112*a* is opposite to the second back side 112*b*. A second FD-SOI transistor T2 is disposed on the second front side 112*a*. A third dielectric layer 14*c* covers and contacts the second front side 112*a* and the second FD-SOI transistor T2. A second air gap AG2 is embedded in the third dielectric layer 14*c* and is disposed directly above the gate G2 of the second FD-SOI transistor T2. A sixth conductive line 16*f* is embedded in the third dielectric layer 14*c* and electrically connected to a source S2 of the second FD-SOI transistor T2. A seventh conductive line 16*g* is embedded in the third dielectric layer 14*c* and electrically connected to a drain D2 of the second FD-SOI transistor T2. A low-resistance handler wafer 18*b* contacts the second back side 112*b*.

Figure 4:
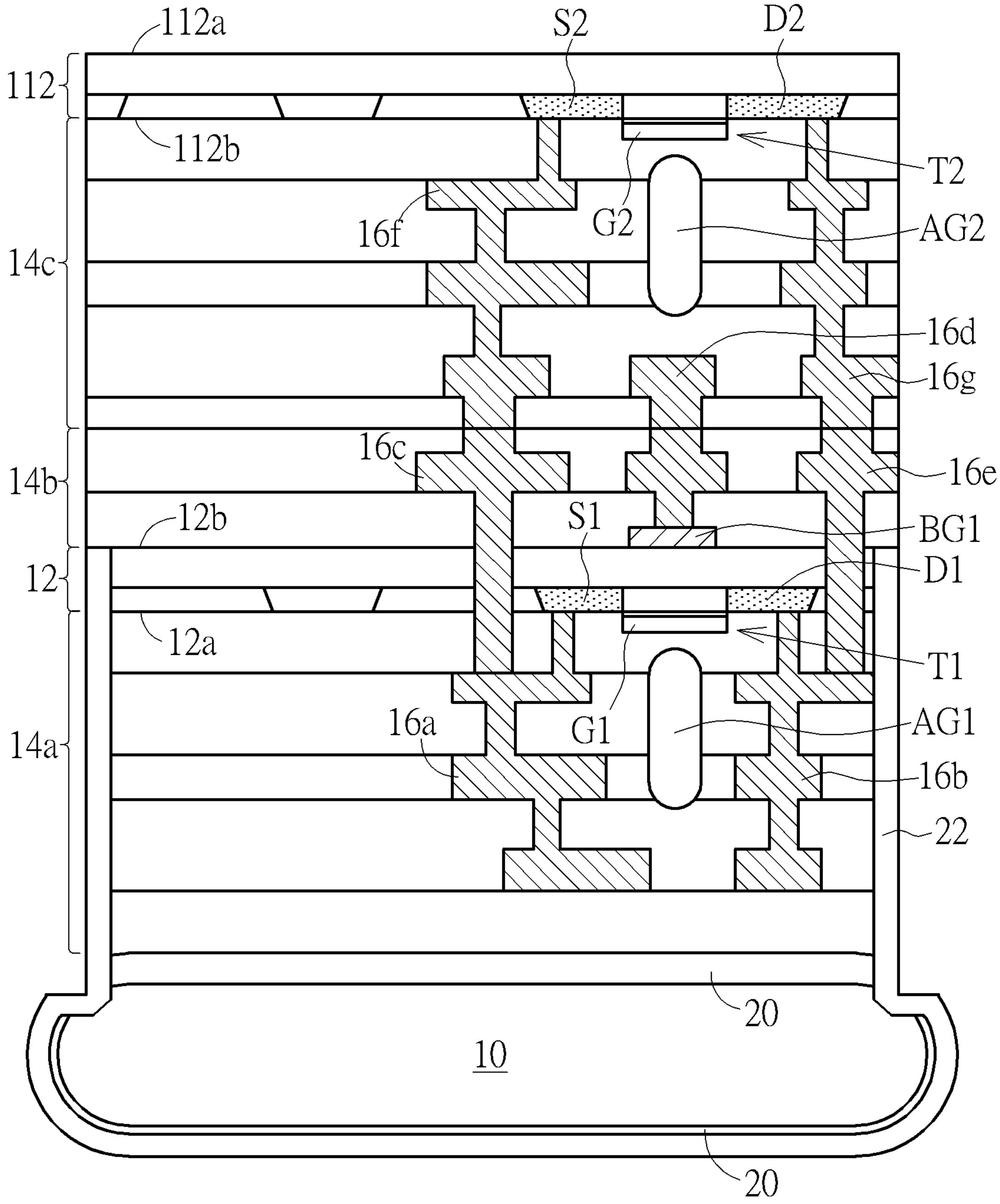
Figure 5:
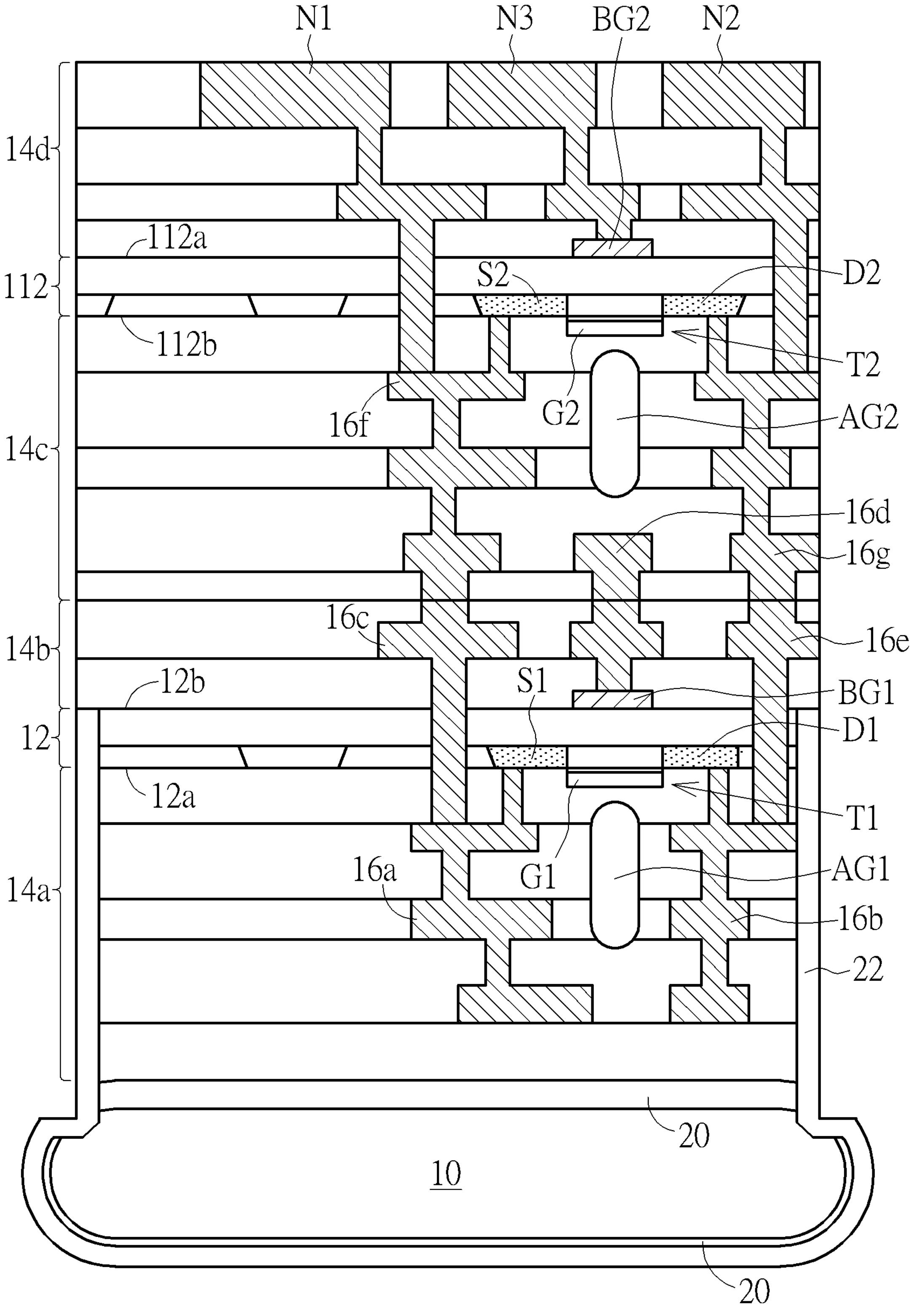
Figure 6:
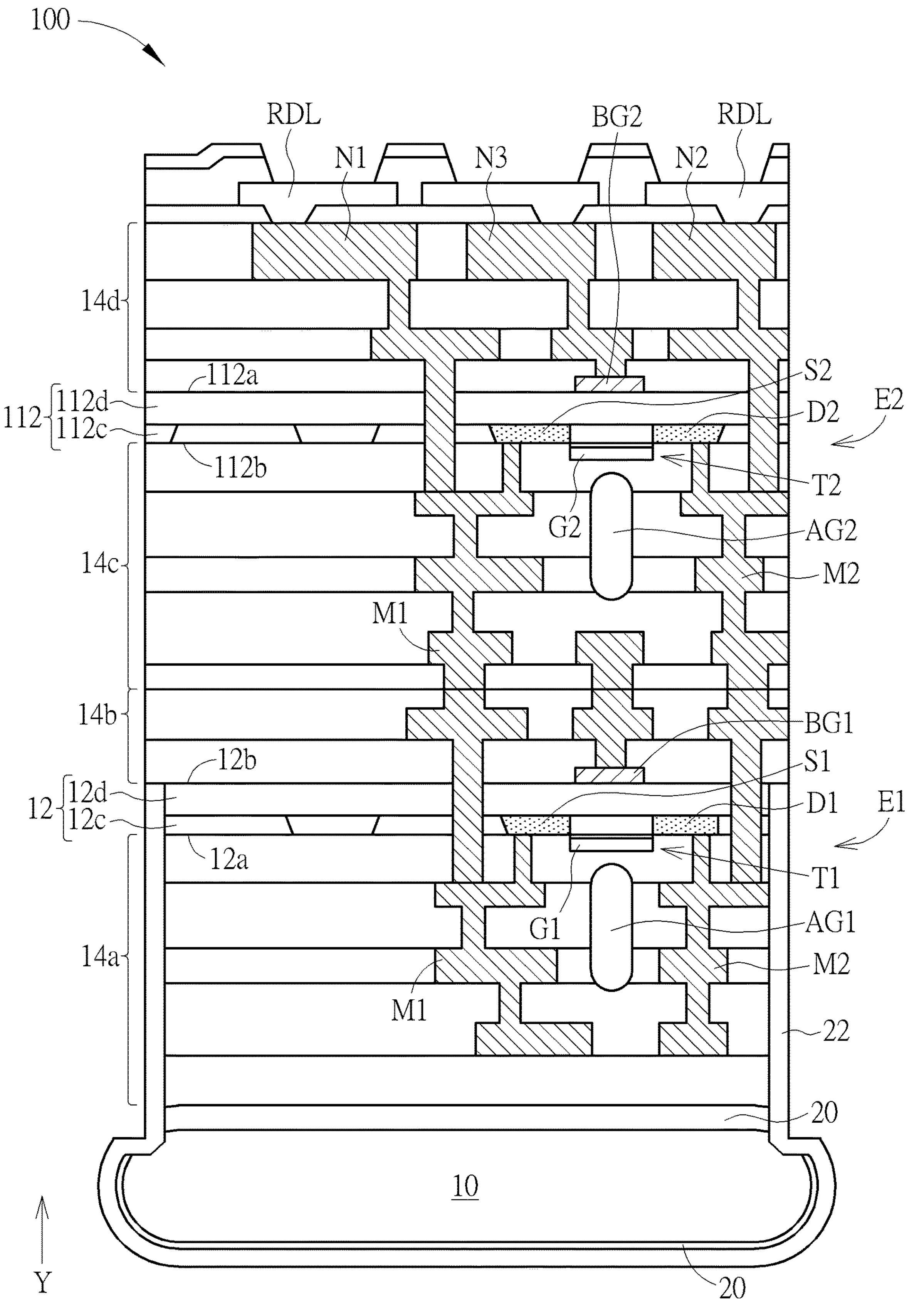

As shown in FIG. 4, the third dielectric layer 14*c* and the second dielectric layer 14*b* are bonded by contacting the third dielectric layer 14*c* to the second dielectric layer 14*b* and heating the third dielectric layer 14*c* and the second dielectric layer 14*b*. Then, the low-resistance handler wafer 18*b* is removed. As shown in FIG. 5, a second back gate BG2 is formed and disposed on the second back side 112*b*. Next, a fourth dielectric layer 14*d* is formed to cover the second back side 112*b*. A first external circuit N1, a second external circuit N2 and a third external circuit N3 are embedded in the fourth dielectric layer 14*d*. The first external circuit N1 contacts and electrically connects to the sixth conductive line 16*f*. The second external circuit N2 contacts and electrically connects to the seventh conductive line 16*g*. The third external circuit N3 contacts the second back gate BG2. As shown in FIG. 6, numerous redistribution line layers RDL are formed to electrically connect the first external circuit N1, the second external circuit N2 and the third external circuit N3. Now, a 3D structure with an FD-SOI transistor 100 of the present invention is completed.

As shown in FIG. 6, a 3D structure with an FD-SOI transistor 100 includes a handler wafer 10, a first device layer E1 and a second device layer E2 stacked from bottom to top in sequence. The first device layer E1 includes a first SOI layer 12, a first FD-SOI transistor T1 and a first back gate BG1. The first SOI layer 12 includes a first front side 12*a* and a first back side 12*b*. The first front side 12*a* and the first back side 12*b* are opposite to each other. The first FD-SOI transistor T1 is disposed on the first front side 12*a*. A first back gate BG 1 is disposed on the first back side 12*b*. In details, the first SOI layer 12 includes a first silicon layer 12*c* and a first silicon oxide layer 12*d*. The first silicon layer 12*c* contacts the first silicon oxide layer 12*d*. The first front side 12*a* is a top surface of the first silicon layer 12*c*, and the first back side 12*b* is a bottom surface of the first silicon oxide layer 12*d*. The thickness of the first silicon oxide layer 12*d* is preferably between 200 and 500 angstroms. The second device layer E2 includes a second SOI layer 112, a second FD-SOI transistor T2 and a second back gate BG2. The second SOI layer 112 includes a second front side 112*a* and a second back side 112*b*. The second front side 112*a* and the second back side 112*b* are opposite to each other. The second FD-SOI transistor T2 is disposed on the second side 112*a*. A second back gate BG 2 is disposed on the second back side 112*b*. In details, the second SOI layer 112 includes a second silicon layer 112*c* and a second silicon oxide layer 112*d*. The second silicon layer 112*c* contacts the second silicon oxide layer 112*d*. The second front side 112*a* is a top surface of the second silicon layer 112*c*, and the second back side 112*b* is a bottom surface of the second silicon oxide layer 112*d*. The thickness of the second silicon oxide layer 112*d* is preferably between 200 and 500 angstroms.

A first dielectric layer 14*a* covers and contacts the first front side 12*a*, and a second dielectric layer 14*b* covers and contacts the first back side 14*b*. A third dielectric layer 14*c* covers and contacts the second front side 112*a* and a fourth dielectric layer 14*d* covers and contacts the second back side 112*b*. The second dielectric layer 14*b* bonds to the third dielectric layer 14*c*. The first dielectric layer 14*a*, the second dielectric layer 14*b*, the third dielectric layer 14*c* and the fourth dielectric layer 14*d* are preferably made of insulating materials, such as silicon oxide, silicon nitride or silicon oxynitride. A first metal interconnection set M1 electrically connects to a source S1 of the first FD-SOI transistor T1 and a source S2 of the second FD-SOI transistor T2. A second metal interconnection set M2 electrically connects to a drain D1 of the first FD-SOI transistor T1 and a drain D2 of the second FD-SOI transistor T2. A first external circuit N1 electrically connects to first metal interconnection set M1. A second external circuit N2 electrically connects to the second metal interconnection set M2. The third external circuit N3 contacts the second back gate BG2. The first metal interconnection set M1 and the second metal interconnection set M2 are embedded in the first dielectric layer 14*a*, the second dielectric layer 14*b*, and the third dielectric layer 14*c*. The first external circuit N1, the second external circuit N2 and the third external circuit N3 are embedded in the fourth dielectric layer 14*d*. Numerous redistribution line layers RDL are disposed on the fourth dielectric layer 14*d*, and each of the redistribution line layers RDL is respectively electrically connected to the first external circuit N1, the second external circuit N2, and the third external circuit N3.

In addition, the handler wafer 10 can be a high-resistance silicon wafer, an insulating material, or a trap-rich substrate. The aforementioned insulating material can be glass, quartz, silicon nitride or other insulating material. Moreover, the resistivity of the insulating material is preferably greater than $10^9$ ohm-meters, which means that the insulating material is preferably a material with a resistivity greater than $10^9$ ohm-meters. Generally, the resistance of wafers used in the semiconductor field is usually between 30 and 200 ohm-meters. However, the resistivity of the handler wafer 10 of the present invention is preferably greater than $10^9$ ohm-meters. Furthermore, the width of the handler wafer 10 is preferably greater than the width of the first dielectric layer 14*a*.

Moreover, the first back gate BG1 and the second back gate BG2 respectively include titanium nitride, doped polysilicon or other conductive materials. The silicon oxide layer 20 encapsulates and contacts the handler wafer 10. The silicon oxide layer 20 bonds to the first dielectric layer 14*a*. The silicon oxide layer 22 contacts the sidewall of the first dielectric layer 14*a*, and the silicon oxide layer 20 and the silicon oxide layer 22 are connected.

Furthermore, a first air gap AG1 is embedded in the first dielectric layer 14*a* and the first air gap AG1 is disposed directly above the gate G1 of the first FD-SOI transistor T1. A second air gap AG2 is embedded in the third dielectric layer 14*c* and the second air gap AG2 is disposed directly above the gate G2 of the second FD-SOI transistor T2. A direction Y is perpendicular to the top surface of the handler wafer 10. Along the direction Y, the first air gap AG1 is aligned with the second air gap AG2. The first FD-SOI transistor T1 and the second FD-SOI transistor T2 can respectively serve as a low-noise amplifier, a switching element or a power amplifier, and their functions can be the same or different.

Figure 7:
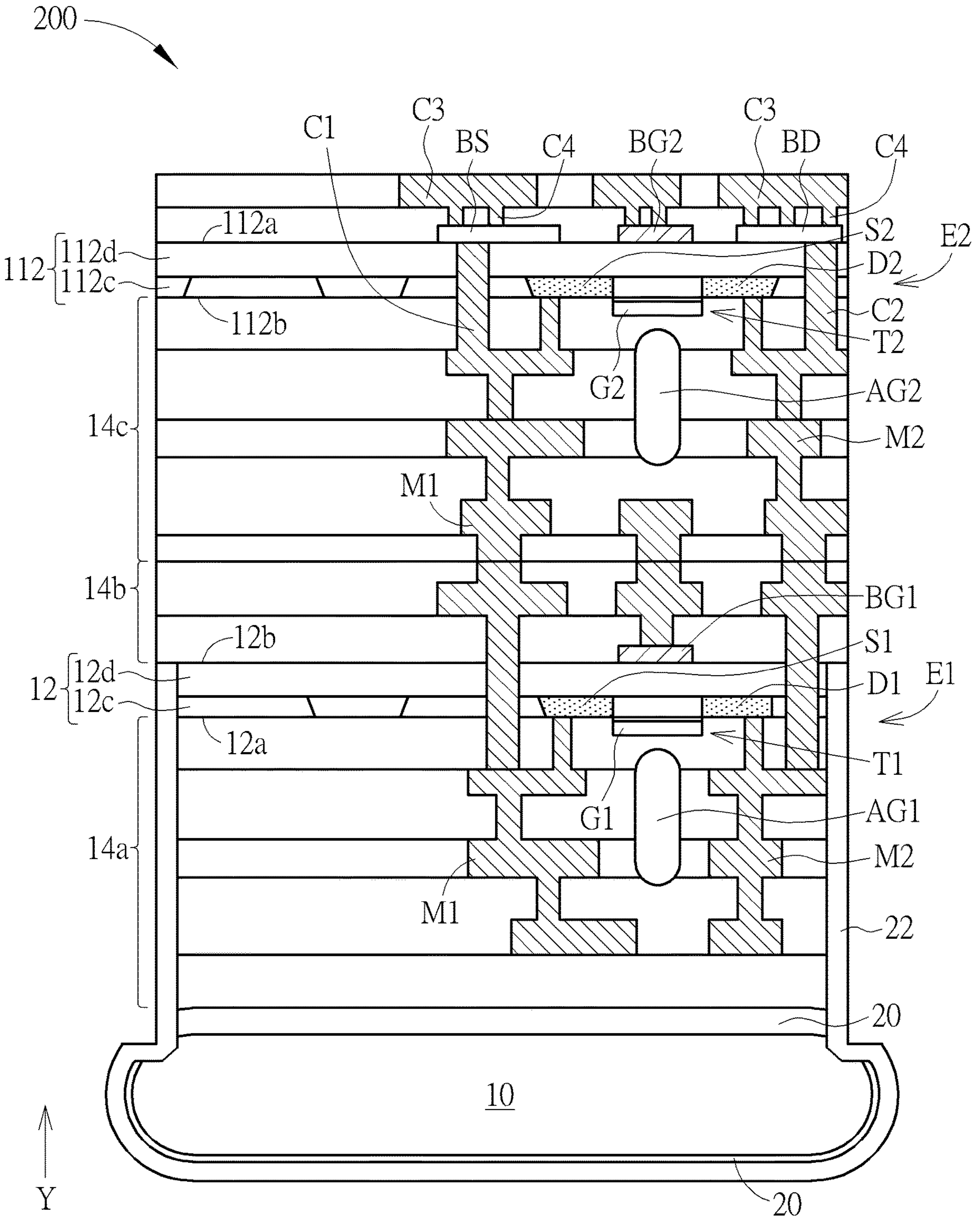
FIG. 7 depicts a fabricating method of a 3D structure with an FD-SOI transistor according to another preferred embodiment of the present invention.

FIG. 7 depicts a fabricating method of a 3D structure with an FD-SOI transistor according to another preferred embodiment of the present invention, wherein elements which are substantially the same as those in the embodiment of FIG. 6 are denoted by the same reference numerals; an accompanying explanation is therefore omitted.

The 3D structure with an FD-SOI transistor 200 in FIG. 7 has a heat dissipation structure. The heat dissipation structure includes a back source BS and a back drain BD. The back source BS and the back drain BD are disposed on the second back side 112*b*, and the back source BS and the back drain BD contact the second silicon oxide layer 112*d*.

The back source BS at least partially overlaps the source S2 of the second FD-SOI transistor T2. The back drain BD at least partially overlaps the drain D2 of the second FD-SOI transistor T2. Moreover, the back source BS electrically connects to the first metal interconnection set M1 by the through via C1, and the back drain BD electrically connects to the second metal interconnection set M2 by the through via C2. Therefore, the back source BS electrically connects the source S1 and the source S2, and the back drain BD electrically connects to the drain electrode D1 and the drain electrode D2. The through via C1 and through via C2 penetrate the second SOI layer 112. Since the back source BS and the back drain DB respectively partially overlap the source S2 and drain D2 of the second FD-SOI transistor T2, the heat generated by the source S2 and the drain D2 can be transmitted to outside through the back source BS and the back drain BD. Furthermore, a conductive plug C4 and a conductive pad C3 can be respectively provided on the back source BS and the back drain BD to achieve better heat dissipation. Other elements of the 3D structure with an FD-SOI transistor 200 are the same as those of the 3D structure with an FD-SOI transistor 100, and therefore the description are omitted.

The present invention stacks wafers with FD-SOI transistors to form a 3D structure. In this way, size of the devices can be reduced and process costs can be decreased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A three-dimensional (3D) structure with fully depleted silicon-on-insulator (FD-SOI) transistors, comprising:
- a handler wafer, a first device layer and a second device layer stacked from bottom to top in sequence, wherein the first device layer comprises:
  - a first silicon-on-insulator (SOI) layer comprising a first front side and a first back side;
  - a first dielectric layer covering and contacting the first front side;
  - a second dielectric layer covering and contacting the first back side;
  - a first FD-SOI transistor disposed on the first front side; and
  - a first back gate disposed on the first back side;
- wherein the second device layer comprises:
  - a second SOI layer comprising a second front side and a second back side;
  - a third dielectric layer covering and contacting the second front side;
  - a fourth dielectric layer covering and contacting the second back side, wherein the second dielectric layer is bonded to the third dielectric layer;
  - a second FD-SOI transistor disposed on the second front side; and
  - a second back gate disposed on the second back side;
- a first metal interconnection set electrically connecting to a source of the first FD-SOI transistor and a source of the second FD-SOI transistor;
- a second metal interconnection set electrically connecting to a drain of the first FD-SOI transistor and a drain of the second FD-SOI transistor;
- a first air gap embedded in the first dielectric layer and disposed on a side of a first gate of the first FD-SOI transistor; and
- a second air gap embedded in the third dielectric layer and disposed on a side of a second gate of the second FD-SOI transistor.

2. The 3D structure with FD-SOI transistors of claim 1, wherein the first SOI layer comprises a first silicon layer and a first silicon oxide layer, the first silicon layer contacts the first silicon oxide layer, the first front side is a top surface of the first silicon layer, and the first back side is a bottom surface of the first silicon oxide layer.

3. The 3D structure with FD-SOI transistors of claim 1, wherein the second SOI layer comprises a second silicon layer and a second silicon oxide layer, the second silicon layer contacts the second silicon oxide layer, the second front side is a top surface of the second silicon layer, and the second back side is a bottom surface of the second silicon oxide layer.

4. The 3D structure with FD-SOI transistors of claim 1, further comprising a third silicon oxide layer covering and contacting the handler wafer, and the third silicon oxide layer is bonded to the first dielectric layer.

5. The 3D structure with FD-SOI transistors of claim 4, further comprising a fourth silicon oxide layer contacting a sidewall of the first dielectric layer and connected to the third silicon oxide layer.

6. The 3D structure with FD-SOI transistors of claim 1, further comprising a first external circuit and a second external circuit respectively embedded in the fourth dielectric layer, wherein the first external circuit electrically connects to the first metal interconnection set, and the second external circuit electrically connects to the second metal interconnection set.

7. The 3D structure with FD-SOI transistors of claim 1, further comprising a third external circuit contacting the second back gate, wherein the third external circuit is embedded in the fourth dielectric layer.

8. The 3D structure with FD-SOI transistors of claim 1, wherein the first back gate and the second back gate respectively comprise titanium nitride or doped polysilicon.

* * * * *